United States Patent
Lee et al.

(10) Patent No.: US 9,023,724 B2
(45) Date of Patent: May 5, 2015

(54) METHOD OF MANUFACTURING SEMICONDUCTOR MEMORY DEVICE

(75) Inventors: Duk Eui Lee, Seoul (KR); Seung Cheol Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 362 days.

(21) Appl. No.: 13/601,785

(22) Filed: Aug. 31, 2012

(65) Prior Publication Data

US 2013/0164925 A1 Jun. 27, 2013

(30) Foreign Application Priority Data

Dec. 22, 2011 (KR) ........................ 10-2011-0140194

(51) Int. Cl.
| H01L 27/115 | (2006.01) |
| H01L 21/768 | (2006.01) |
| H01L 21/02 | (2006.01) |
| C11D 11/00 | (2006.01) |

(52) U.S. Cl.
CPC .... H01L 27/11521 (2013.01); H01L 21/76814 (2013.01); H01L 21/7682 (2013.01); H01L 21/02063 (2013.01); C11D 11/0047 (2013.01)

(58) Field of Classification Search
CPC ............... H01L 21/76814; H01L 21/7682; H01L 21/02063; H01L 21/0206; H01L 27/11521

See application file for complete search history.

(56) References Cited

U.S. PATENT DOCUMENTS

| 5,472,513 | A | * | 12/1995 | Shiramizu | 134/3 |
| 6,897,159 | B1 | * | 5/2005 | Lee et al. | 438/714 |
| 7,001,470 | B2 | | 2/2006 | Tange et al. | |
| 7,138,340 | B2 | * | 11/2006 | Lee et al. | 438/737 |
| 7,199,060 | B2 | * | 4/2007 | Schwalbe et al. | 438/725 |
| 2002/0068439 | A1 | * | 6/2002 | Dong et al. | 438/637 |
| 2004/0121590 | A1 | * | 6/2004 | Moon et al. | 438/639 |
| 2005/0136649 | A1 | * | 6/2005 | Lee et al. | 438/637 |
| 2006/0100794 | A1 | * | 5/2006 | Weber | 702/22 |
| 2007/0145458 | A1 | | 6/2007 | Asami | |
| 2008/0003799 | A1 | * | 1/2008 | Kim et al. | 438/597 |
| 2008/0102594 | A1 | * | 5/2008 | Kim et al. | 438/381 |
| 2009/0011587 | A1 | * | 1/2009 | Tsai et al. | 438/592 |
| 2012/0070976 | A1 | * | 3/2012 | Kim et al. | 438/594 |

FOREIGN PATENT DOCUMENTS

| CN | 101370885 | * | 2/2009 |
| CN | 103178015 | * | 6/2013 |
| KR | 1019970077208 | | 12/1997 |
| KR | 100223695 | | 10/1999 |
| KR | 100641780 | | 11/2006 |
| KR | 1020100107732 | | 10/2010 |

* cited by examiner

*Primary Examiner* — Mary Wilczewski
*Assistant Examiner* — Toniae Thomas
(74) *Attorney, Agent, or Firm* — IP & T Group LLP

(57) ABSTRACT

A method of manufacturing a semiconductor memory device comprises forming a plurality of gate lines on a semiconductor substrate, forming an insulating layer on the gate lines, and performing a cleaning process using a surfactant-free cleaning solution having a viscosity of lower than 2 cP and an acidity of lower than 3 pH to remove residue from the surface of the insulating layer.

18 Claims, 2 Drawing Sheets

METHOD OF MANUFACTURING SEMICONDUCTOR MEMORY DEVICE

CROSS-REFERENCE TO RELATED APPLICATION

This application claims priority to and the benefit of Korean Patent Application No. 10-2011-0140194, filed on Dec. 22, 2011, the disclosure of which is incorporated herein by reference in its entirety.

BACKGROUND

The present invention relates to a method of manufacturing a semiconductor memory device. More specifically, the present invention relates to a process of cleaning a semiconductor memory device.

A semiconductor memory device includes a plurality of gate lines, such as word lines.

The word lines may be disposed parallel to one another on a semiconductor substrate and connected to a plurality of memory cells. Accordingly, as a distance between adjacent word lines decreases, a distance between the memory cells may also decrease. Meanwhile, as the integration density of semiconductor memory devices gradually increases, a distance between word lines is gradually narrowing, and thus interference between memory cells is gradually increasing.

Accordingly, research into techniques for reducing the interference between the memory cells, for example, a technique of forming air gaps between word lines, is progressing at a rapid pace.

To form the air gaps between the word lines, upper portions of the word lines should be covered with an insulating layer, and a cleaning process for removing residue generated during a manufacturing process should be performed after the cleaning process. While the cleaning process may be performed using a dry method, a dry cleaning process makes it difficult to completely remove the residue. Therefore, the cleaning process is typically performed using a wet method. Meanwhile, there may be cases where air gaps are exposed through the insulating layer due to a manufacturing process. In a wet cleaning process, a cleaning solution may flow into the exposed air gaps, thereby causing defects in the semiconductor memory device.

The above-described problems will now be described in detail with reference to the appended drawings.

FIG. 1 is a cross-sectional view illustrating a conventional semiconductor memory device.

Referring to FIG. 1, a semiconductor memory device, including a plurality of gate lines 12 formed on a semiconductor substrate 11, air gaps 14 formed between the gate lines 12, and an insulating layer 13 formed on the entire structure may be provided. For example, the plurality of gate lines 12 may functions as word lines. Each of the gate lines 12 may include a stack structure of a tunnel insulating layer, a floating gate, a dielectric layer, and a control gate. The insulating layer 13 may be formed on the entire structure to form the air gaps 14 between the gate lines 12. Thereafter, although not shown in the cross-sectional view of FIG. 1, a contact hole may be formed in a cell region or a peripheral circuit region. The contact hole may be formed by forming a photoresist pattern (not shown) on the insulating layer 13 and performing an etching process using the photoresist pattern as an etch mask. The photoresist pattern may then be removed.

When a strip process for removing the photoresist pattern is performed, residue (or by-products) generated during the etching of the insulating layer 13 may mostly be removed. However, since some residue may still remain, a cleaning process may be performed. Typically, the cleaning process may be performed by a wet method, using a buffered oxide etchant (BOE) solution, which may include hydrofluoric acid (HF) and a buffering agent, such as ammonium fluoride ($NH_4F$).

The BOE solution may have a low viscosity at a high temperature and may have a high viscosity at a low temperature. For example, assuming that deionized water (DIW) has a viscosity of 1 cP, the BOE solution may have a viscosity of about 4.8 cP at a temperature of about 90° C., and a viscosity of about 18 cP at about 25° C. (hereinafter referred to as room temperature).

In addition, if the BOE solution contains a surfactant, and an open region OP is formed in a portion of the insulating layer 13, the BOE solution may permeate more deeply into the air gaps 15 due to the surfactant. Accordingly, even if the BOE solution is dried, the BOE solution may remain within the air gaps 15. A high concentration of sulfuric acid ($H_2SO_4$) may be generated due to the remaining BOE solution and fumes (e.g., $SO_4$) may form within the air gaps 15. Furthermore, a portion of the insulating layer 13 formed on sidewalls of the gate lines 12 may be removed due to the BOE solution, thereby allowing the BOE solution to permeate into the semiconductor substrate 11 and the gate lines 12. In particular, since the BOE solution has an acidity of about 6 to 7 pH, the gate lines 12 may be partially oxidized due to hydroxide ($OH^-$) ions or bifluoride ($HF_2^-$) ions from the BOE solution, so that the gate lines 12 may be damaged.

FIG. 2 is a photograph of a cross-section of a conventional semiconductor memory device, illustrating conventional problems.

Referring to FIG. 2, as described above with reference to FIG. 1, when gate lines are damaged by a cleaning solution, some of the gate lines may collapse (refer to 21) or have reduced areas (refer to 22), thereby reducing yield and degrading the reliability of semiconductor memory devices.

SUMMARY OF THE INVENTION

The present invention is directed to a cleaning method by which the reliability of a process of manufacturing a semiconductor memory device can be improved.

One aspect of the present invention provides a method of manufacturing a semiconductor memory device, the method including: forming a plurality of gate lines on a semiconductor substrate, forming an insulating layer on the gate lines, and performing a cleaning process using a surfactant-free cleaning solution having a viscosity of lower than 2 cP and an acidity of lower than 3 pH to remove residue from the surface of the insulating layer.

Another aspect of the present invention provides a method of manufacturing a semiconductor memory device, the method including: forming a plurality of gate lines on a semiconductor substrate, forming air gaps between the gate lines and forming an insulating layer on a structure having the air gaps, and performing a cleaning process using a surfactant-free cleaning solution having a viscosity of lower than 2 cP and an acidity of lower than 3 pH at to remove residue from the surface of the insulating layer.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF EMBODIMENTS

The present invention will be described more fully hereinafter with reference to the accompanying drawings, in which exemplary embodiments of the invention are shown. This invention may, however, be embodied in different forms and should not be construed as limited to the embodiments set forth herein. Rather, these exemplary embodiments are provided so that this disclosure is thorough and complete and fully conveys the scope of the present invention to one skilled in the art.

Figure 1:
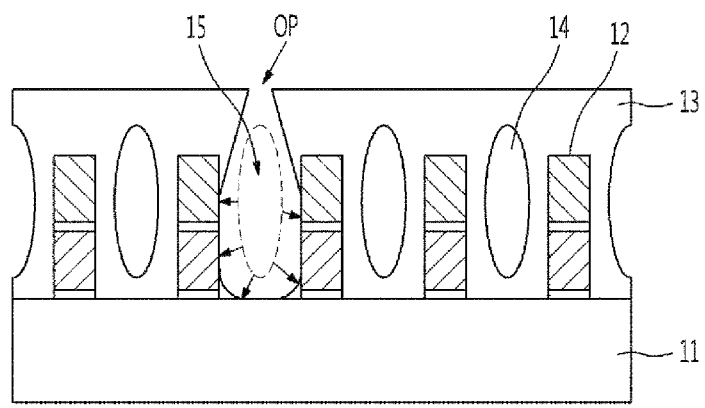
FIG. 1 is a cross-sectional view illustrating a semiconductor memory device.
Figure 2:
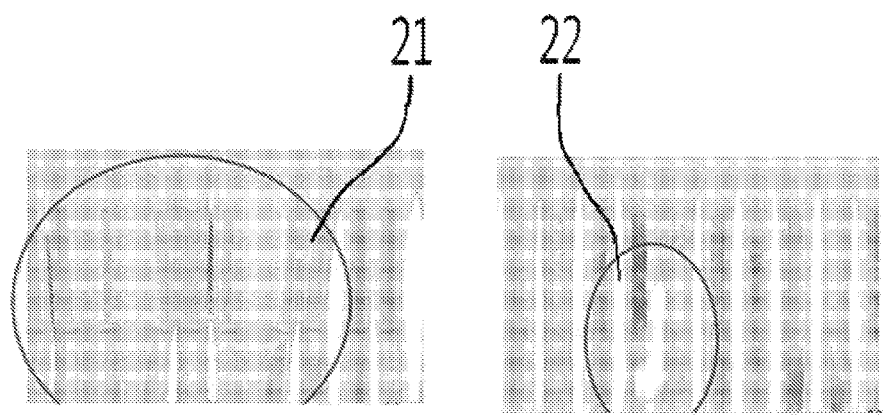
FIG. 2 is a photograph of the cross-section of a conventional semiconductor memory device, illustrating conventional problems.
Figure 3:
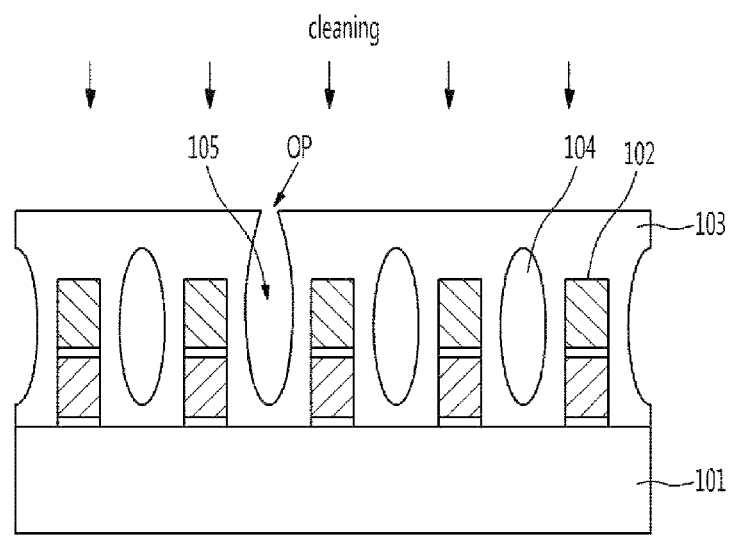
FIG. 3 is a cross-sectional view illustrating a method of manufacturing a semiconductor memory device according to an exemplary embodiment of the present invention.

FIG. 3 is a cross-sectional view illustrating a method of manufacturing a semiconductor memory device according to an exemplary embodiment of the present invention.

Referring to FIG. 3, a semiconductor memory device, including a plurality of gate lines 102 formed on a semiconductor substrate 101, air gaps 104 formed between the gate lines 102, and an insulating layer 103 formed on the entire structure, may be provided.

For example, the plurality of gate lines 102 may function as word lines. Each of the gate lines 102 may include a stack structure of a tunnel insulating layer, a floating gate, a dielectric layer, and a control gate. The insulating layer 103 may be formed on the entire structure to form the air gaps 104 between the gate lines 102. The insulating layer 103 may include an oxide layer, such as silicon oxide ($SiO_2$) layer.

An etching process, for forming the air gaps 104 between the gate lines 102 may be further performed. Also, an etching process for forming air gaps in an isolation layer (not shown) may be performed. In addition, the air gaps 104 may be formed using various methods.

Thereafter, although not shown in the cross-sectional view of FIG. 3, a contact hole may be formed in a cell region or a peripheral circuit region. The contact hole may be formed by forming a photoresist pattern (not shown) on the insulating layer 103 and performing an etching process using the photoresist pattern as an etch mask. The photoresist pattern may be removed using a strip process.

In this case, carbon-based residue (or by-products) may be generated during a process of etching a portion of the insulating layer 103. The residue may be mostly removed during the strip process for removing the photoresist pattern. However, since part of the residue may still remain after the strip process, a cleaning process for removing the residue may be performed.

The cleaning process will now be described in detail.

The cleaning process may be performed using a wet cleaning process. A cleaning solution used for the wet cleaning process may have a lower viscosity and acidity than a BOE solution and be free from a surfactant. For example, a surfactant-free cleaning solution having a viscosity of lower than 2 cP at room temperature and an acidity of lower than 3 pH at room temperature, may be used.

The cleaning solution may be a hydrofluoric acid (HF) solution or a standard clean (SC)-1 solution. The SC-1 solution may be a solution mixture of ammonium hydroxide ($NH_4OH$), hydrogen peroxide ($H_2O_2$), and water ($H_2O$). The HF solution may be a mixture of HF and $H_2O$. The HF solution may be prepared by mixing HF and $H_2O$ in a ratio of about 1:100. The prepared HF solution may have a viscosity of about 1 cP and an acidity of about 2.7 pH, at room temperature.

Since the HF solution has about $1/1000$ the molar concentration of $OH^-$ ions of the BOE solution (which has an acidity of about 6 to 7 pH), the HF solution may have about $1/1000$th the number of $OH^-$ groups of the BOE solution.

Accordingly, since the HF solution does not contain the surfactant, the HF solution is less likely to permeate into open regions OP of the insulating layer 103, as compared to the BOE solution. Moreover, even if part of the HF solution permeates into the air gaps 105 through the open regions OP, since the HF solution has less hydroxyl ($OH^-$) groups than the BOE solution, oxidation of the floating gates may be more effectively inhibited, as compared to the BOE solution.

Figure 4:
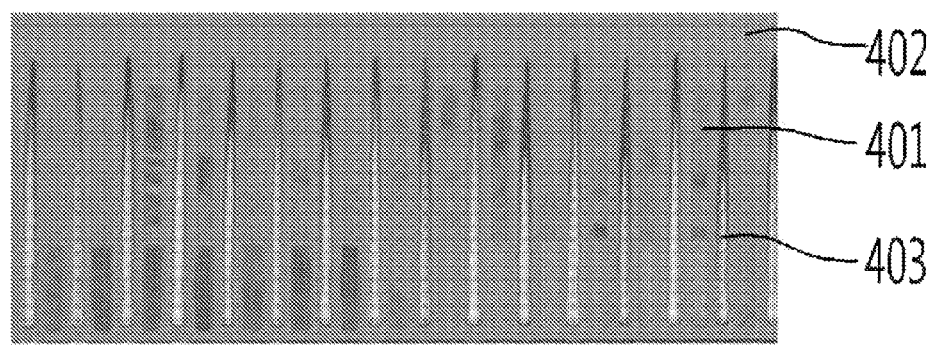
FIG. 4 is a photograph of the cross-section of a semiconductor memory device according to an exemplary embodiment of the present invention.

FIG. 4 is a photograph of the cross-section of a semiconductor memory device according to an exemplary embodiment of the present invention.

Referring to FIG. 4, even if an open region is formed in a portion of an insulating layer 402, which is supposed to completely cover air gaps 403 to maintain the air gaps 403, an occurrence of defects due to a cleaning solution, for example, oxidation and collapse of the gate lines 401, may be inhibited. Accordingly, the gate lines 401 (e.g., word lines) may be maintained as uniform patterns, fumes may be prevented, yield may be increased, and the reliability of semiconductor memory devices may be improved.

Although the above-described embodiment describes a cleaning process performed after covering the entire structure with the insulating layer 402 to form the air gaps 403 between the gate lines 410, the above-described cleaning process may be applied to other cleaning process performed during manufacturing processes of semiconductor memory devices. For example, the above-described cleaning process may be applied to various manufacturing steps, such as a cleaning process performed after forming bit lines, a cleaning process performed after forming gate lines in a peripheral circuit region, a cleaning process performed after forming a junction region in a semiconductor substrate between the gate lines, a cleaning process performed after forming gate lines, a cleaning process performed after forming spacers on sidewalls of the gate lines, or a cleaning process performed after forming an interlayer insulating layer.

Accordingly, the present invention may prevent a cleaning solution from flowing into air gaps during a cleaning process of a semiconductor memory device having air gaps formed between gate lines. Moreover, even if the cleaning solution were to flow into the air gaps, the cleaning solution could easily be removed, thereby increasing yield and improving the reliability of the semiconductor memory device.

In the drawings and specification, there have been disclosed typical exemplary embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A method of manufacturing a semiconductor memory device, the method comprising:

forming a plurality of gate lines on a semiconductor substrate;

forming an insulating layer on the gate lines; and performing a cleaning process using a surfactant-free cleaning solution, having a viscosity of lower than 2 cP and an acidity of lower than 3 pH to remove residue from the surface of the insulating layer.

2. The method of claim 1, wherein the cleaning process is performed using a wet cleaning process.

3. The method of claim 1, wherein the surfactant-free cleaning solution is a hydrofluoric acid (HF) solution or a standard clean (SC)-1 solution.

4. The method of claim 3, wherein the SC-1 solution is a mixture of ammonium hydroxide ($NH_4OH$), hydrogen peroxide ($H_2O_2$), and water ($H_2O$), and the HF solution is a solution mixture of HF and $H_2O$.

5. The method of claim 3, wherein the HF solution is a mixture of HF and $H_2O$ in a ratio of about 1:100 and has an acidity of about 2.7 pH.

6. The method of claim 3, wherein each of the HF solution and the SC-1 solution each have a viscosity of about 1 cP and an acidity of about 2.7 pH.

7. The method of claim 1, further comprising:

forming a photoresist pattern on the insulating layer, the photoresist pattern having an opening formed by partially exposing a region of the insulating layer in which a contact hole will be formed;

forming the contact hole exposing a portion of the semiconductor substrate by removing the exposed insulating layer;

removing the photoresist pattern; and performing the cleaning process.

8. The method of claim 1, wherein the insulating layer includes a silicon dioxide ($SiO_2$) layer.

9. The method of claim 1, wherein the surfactant-free cleaning solution has the viscosity of lower than 2 cP and the acidity of lower than 3 pH at about 25° C.

10. A method of manufacturing a semiconductor memory device, the method comprising:

forming a plurality of gate lines on a semiconductor substrate;

forming air gaps between the gate lines and forming an insulating layer on a structure having the air gaps; and performing a cleaning process using a surfactant-free cleaning solution, having a viscosity of lower than 2 cP and an acidity of lower than 3 pH to remove residue from the surface of the insulating layer.

11. The method of claim 10, wherein the cleaning process is performed using a wet cleaning process.

12. The method of claim 10, wherein the surfactant-free cleaning solution is a hydrofluoric acid (HF) solution or a standard clean (SC)-1 solution.

13. The method of claim 12, wherein the SC-1 solution is a mixture of ammonium hydroxide ($NH_4OH$), hydrogen peroxide ($H_2O_2$), and water ($H_2O$), and the HF solution is a solution mixture of HF and $H_2O$.

14. The method of claim 12, wherein the HF solution is a mixture of HF and $H_2O$ in a ratio of about 1:100 and has an acidity of about 2.7 pH.

15. The method of claim 12, wherein each of the HF solution and the SC-1 solution each have a viscosity of about 1 cP and an acidity of about 2.7 pH.

16. The method of claim 10, further comprising:

forming a photoresist pattern on the insulating layer, the photoresist pattern having an opening formed by partially exposing a region of the insulating layer in which a contact hole will be formed;

forming the contact hole exposing a portion of the semiconductor substrate by removing the exposed insulating layer;

removing the photoresist pattern; and performing the cleaning process.

17. The method of claim 10, wherein the insulating layer includes a silicon dioxide ($SiO_2$) layer.

18. The method of claim 10, wherein the surfactant-free cleaning solution has the viscosity of lower than 2 cP and the acidity of lower than 3 pH at about 25° C.

* * * * *